United States Patent [19]

Heuber et al.

[11] 4,023,148
[45] May 10, 1977

[54] WRITE SPEED-UP CIRCUIT FOR INTEGRATED DATA MEMORIES

[75] Inventors: Klaus Heuber, Boeblingen; Wilfried Klein, Holzgerlingen; Knut Najmann, Gaertringen; Siegfried K. Wiedmann, Stuttgart, all of Germany

[73] Assignee: International Business Machines Corporation, Armonk, N.Y.

[22] Filed: Nov. 26, 1975

[21] Appl. No.: 635,538

[30] Foreign Application Priority Data

Dec. 7, 1974 Germany .......................... 2457921

[52] U.S. Cl. .......................... 340/173 R; 307/238; 357/43
[51] Int. Cl.² .......................... G11C 11/40
[58] Field of Search ................. 340/173 R, 173 FF; 307/238, 279; 357/43

[56] References Cited
UNITED STATES PATENTS

| 3,949,385 | 4/1976 | Sonoda | 340/173 R |
| 3,953,839 | 4/1976 | Dennison | 340/173 FF |

Primary Examiner—Terrell W. Fears
Attorney, Agent, or Firm—Francis J. Thornton

[57] ABSTRACT

Modern bipolar cross coupled memory cells for high density arrays use diodes as coupling elements from the cell to the bit lines. The write operation of these cells requires a high amount of current if the current gain of the cell transistors is high. The time required to perform a write operation is prolonged significantly due to the inherent capacitors in the cell known as the Miller effect. The described circuit completely eliminates the Miller effect during the write operation and makes the required write current completely independent of the current gain of the cell transistors.

In the present invention this is accomplished by dropping the word line of such a cell from a stand-by potential to a select potential, so that the inner cell nodes are equally discharged, without disturbing the state of the cell, after which the word line is pulsed up to an intermediate potential between the select potential and the stand-by potential.

11 Claims, 4 Drawing Figures

WRITE SPEED-UP CIRCUIT FOR INTEGRATED DATA MEMORIES

BACKGROUND OF THE INVENTION

1. Field of the Invention

The invention relates to a write speed-up circuit for integrated data memories and more particularly to a speed-up circuit for use with cross-coupled, bipolar transistor storage cells.

2. Description of the Prior Art

Storage cells of cross coupled bipolar transistors are described in commonly assigned U.S. Pat. No. 3,505,573 and in U.S. Pat. No. 3,693,057. The operation of such a cross coupled bipolar storage cell is described in detail in the first-mentioned patent. In such a storage cell one transistor is always conductive while the other is non-conductive. In stand-by, the current flows through the conductive transistor whose emitter is at a potential of 0 Volt. When addressing, the emitter of the conductive transistor is rendered non-conductive, and a current flows via the emitter resistor whose voltage drop is detected as a read pulse. When information is written into the storage cell the conductive transistor, upon the application of an addressing pulse to its emitter, is cut off. The diodes which are arranged in parallel to the two collector resistors effect a high current switching upon the addressing. In stand-by, these two diodes are off, whereas upon addressing the diode of the conductive collector branch becomes conductive, and thus a relatively low resistance is arranged in parallel to the conductive collector resistor. If several such storage cells are provided in a word-organized memory, the word selection is performed by means of decreasing the word line potential by about 1 V relative to the potential of the unselected word lines in the memory. From the selected word, bits are selected by driving both bit lines and writing is achieved by driving only one bit line. Such cells, because of inherent capacitance in the cells, require relatively long write times, high write currents, and consequently require higher power.

SUMMARY OF THE INVENTION

Broadly speaking, the present invention is directed towards a circuit and a technique for writing data in cross-coupled bipolar transistor storage cells which reduces the write current, the power dissipation upon writing, and the writing time of such cells.

More particularly, the present invention teaches a speed-up circuit that selectively pulses the word line to speed-up the writing of information into the storage cell.

By using the present invention, reduction of the write current and also an increase of the writing speed is attained. The invention can be particularly used with diode coupled storage cells with bipolar transistors. Also this writing action into a diode-coupled storage cell with cross-coupled bipolar transistors is independent of the current amplification of the bipolar transistors.

DESCRIPTION OF THE DRAWINGS

These and other features of the present invention will be more fully appreciated and understood by considering the following description taken in conjunction with the accompanying drawings in which.

DESCRIPTION OF THE PREFERRED EMBODIMENT

Figure 1:
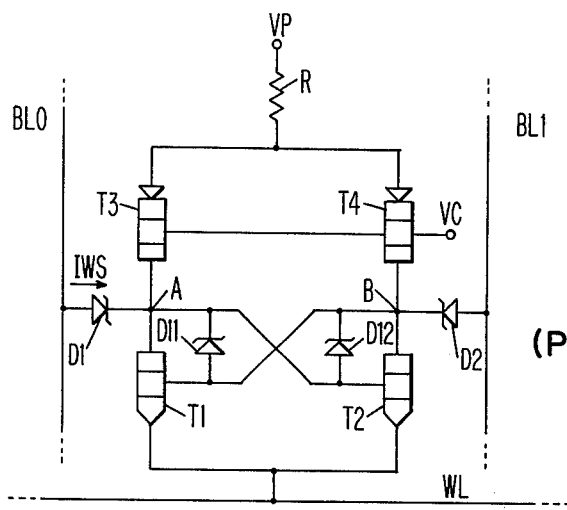
FIG. 1 shows schematically a known diode-coupled storage cell with cross-coupled bipolar transistors and bipolar load transistors.
Figure 2:
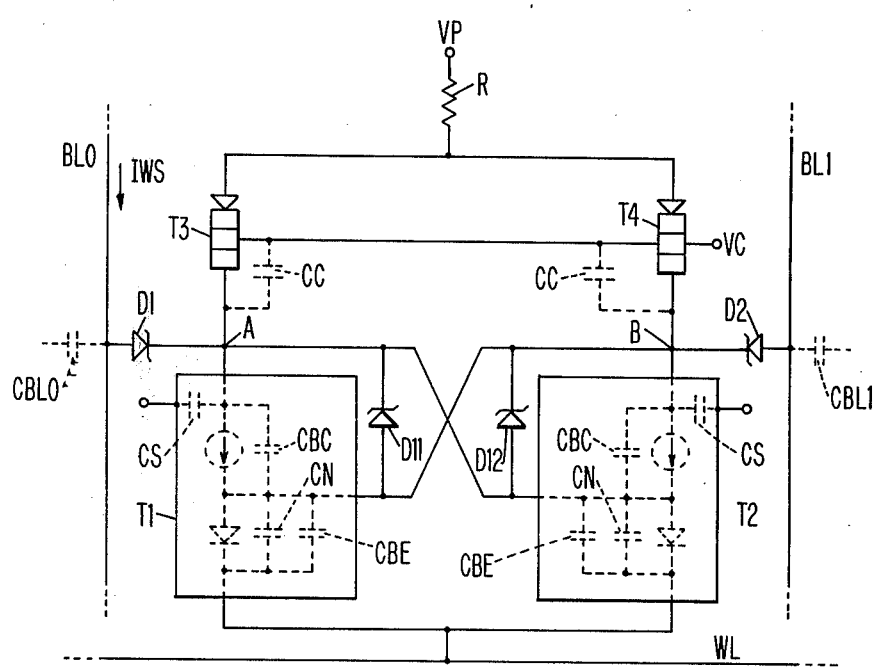
FIG. 2 depicts an equivalent circuit diagram in accordance with FIG. 1.

Referring first to FIGS. 1, and 2, there will be described a prior art cell and the capacitances and time delays inherent therewith. FIG. 1 shows the circuit diagram of a known diode-coupled storage cell with cross-coupled bipolar transistors and bipolar load transistors. The storage cell of FIG. 1 consists of the two cross-coupled bipolar transistors T1 and T2 whose emitters are coupled to word line WL. The collectors of the two transistors T1 and T2 are connected to node A and node B, respectively. Also connected to node A is the base of transistor T2, the collector of load transistor T3, and the cathode of the Schottky diode D1 whose anode is connected to bit line BL0. Applied to node B is the collector of load transistor T4, the base of transistor T1, and the cathode of the Schottky diode D2 whose anode is connected to bit line BL1. Additionally, clamping diodes D11 and D12 are provided in the cross-coupling branches between the collector and base of each of the transistors T1 and T2. The bases of load transistors T3 and T4 are interconnected to a constant potential Vc and their emitters also interconnected via a resistor R to a predetermined potential VP.

FIG. 2 shows an equivalent circuit diagram of the storage cell in accordance with FIG. 1. This equivalent particularly shows stray capacity CS, collector capacity CC of the load transistors, and bit line capacity CBL0 and CBL1, respectively. Diffusion capacity CN and junction capacity CBE form the entire base emitter capacity of the switching transistors T1 and T2 whose collector capacity is indicated as CBC.

In order to show the delays inherent in the writing of such cells due to such capacitances, the writing sequence with the involved circuit elements of the storage cell and the voltages and currents required, is described in detail below. It is assumed that a storage cell as shown in FIG. 1 is selected in the memory, i.e. that the potential of the word line WL is at −4V, that a transistor T1, is switched on, and that the bit line, BL1, is at −4V. The bipolar transistors T3 and T4 serve as load resistors and have a 3 microampere collector current. For writing into the storage cell bit line BL0 is driven so that a write current IWS flows as indicated by the arrow from bit line BL0 via diode D1 into node A at the collector of transistor T1 to raise its potential until transistor T2 becomes conductive. The collector current Ic required is:

$$Ic = \beta \times IB$$

Where IB is the base current and $\beta$ is the gain or current amplification of the transistor. In this circuit, a collector current of 0.42 mA is required when the base current IB is 3 $\mu$A and the current amplification $\beta$ is 140. Also, as described below, the capacitance effect affects the write operation, i.e. delays it. At the collector of transistor T1 there is applied the stray capacity CS, the collector base capacity CBC, and the collector basis capacity CC of PNP transistor T3 as shown in FIG. 2. The bit line BLO has the capacity CBLO.

The capacity C to be recharged by about 0.5 Volt by write current IWS supplied via the bit line is composed as follows:

$$C = CBLO + CC + CS + \beta \times CBC$$

If a write current of 0.8 mA is assumed the following is obtained for the recharge time $t$:

$$t = C \times \frac{0.5\ V}{0.8\ mA - Ic}$$

In order to demonstrate that this writing method described demands not only high currents but also involves very long write periods, the capacity C and the recharge time $t$ is calculated, using as a basis the following valves actually occuring in such circuits. The following values are used in the calculation:

$$CBLO = 2pF$$

$$CC = 0.02\ pf$$

$$CS = 0.15\ pF$$

$$CBC = 0.18\ pF$$

and $$\beta = 140.$$

With these values as a basis, and by applying them to the above given formulae for the capacity C to be recharged is found to be:

27.37 pF.

and its recharge time $t$ is found to be 36 nanoseconds.

Figure 3:
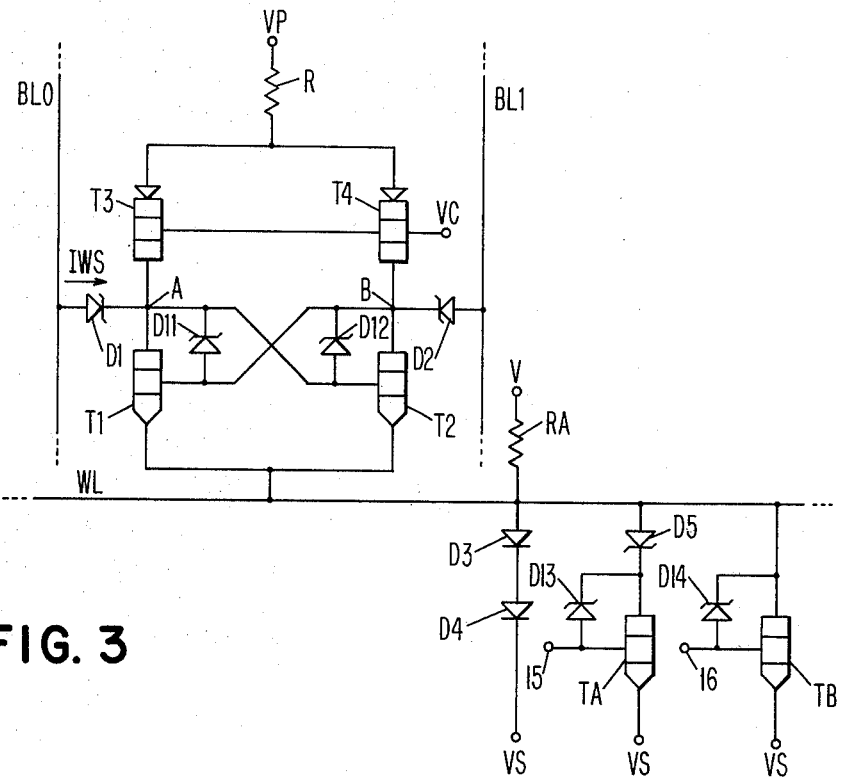
FIG. 3 shows schematically the circuit of the present invention for increasing the writing speed of a storage cell.
Figure 4:
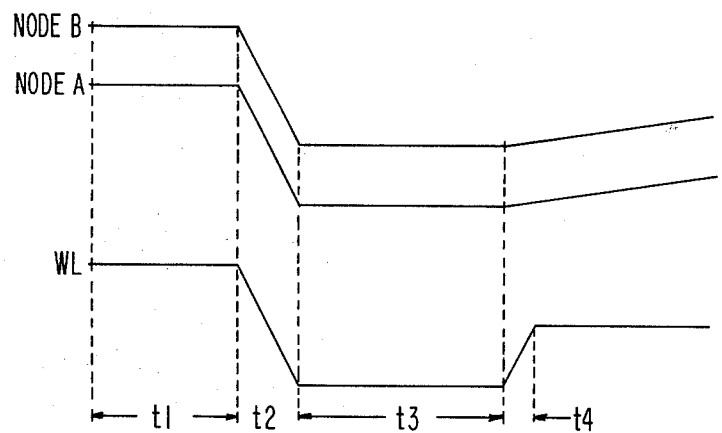
FIG. 4 sets forth a pulse diagram for explaining the operation of the circuit of FIG. 3.

Referring now to FIGS. 2, 3, and 4, an improved circuit arrangement and node of operation in accordance with the present invention will be described. Although the description of the operation of the circuit will basically be made with respect to FIG. 3, reference will be made to the equivalent circuit diagram of FIG. 2 since it shows the capacities of interest of the storage cell and to FIG. 4 which shows the voltage pulses appearing at the nodes A and B and at the word line WL of the circuit shown in FIG. 3.

The cross coupled storage cell of FIG. 3 is that of FIG. 1 but has, in accordance with the present invention, coupled to its word line WL; one end of a resistor RA, the other end of which is coupled to a voltage source V; a pair of serially arranged diodes D3 and D4, whose cathodes are coupled to a voltage supply VS; and the collectors of two transistors TA and TB whose emitters are also coupled to the voltage supply VS. A Schottky clamping diode D5 is coupled between the word line WL and the collector of transistor TA. Other Schottky diodes D13 and D14 are respectively connected between the base and collector of the respective transistors TA and TB. The base of each transistor TA and TB is coupled to suitable respective pulse sources 15 and 16.

For purposes of illustration, it will be assumed, for example, that the cross coupled cell is initially in stand-by. In this state, the word line WL is at stand-by potential as shown in FIG. 4 during the time $t1$. The transistor T1 is conductive and the transistor T2 is non-conductive. This stand-by potential is determined by the resistor RA and the diodes D4 and D3. In this condition, a stand-by current flows through transistor T1 and diodes D4 and D3.

At the end of time $t1$, suitable select pulses from sources 15 and 16 are applied to the bases of transistors TA and TB to become conductive and cause the word line potential WL, as indicated by the decline in WL potential during the time $t2$, to drop to the select potential (about 1.0 volts) as indicated by that portion of the curve WL during time $t3$. During time $t2$ when the potential on the word line WL falls to 1.0 volt, the diodes D3 and D4 become non-conductive. Both transistors T1 and T2 are both rendered conductive and the capacitance at nodes A and B are both discharged as indicated by the decline in the curves A and B during time $t2$. Because the capacitance of nodes A and B are approximately equal in value, the state of the cell remains undisturbed. During time $t3$, the diodes D3 and D4 remain off and because the capacitance at nodes A and B has been discharged, the transistor T2 turns off, and the current through transistor T1 falls back to the stand-by level. By holding the two bit lines BLO and BL1 at a potential of −3 volts, the two coupling diodes D1 and D2 remain non-conductive.

During time $t3$, both transistors TA and TB are conductive. Transistor TB has its emitter at the voltage VS and its collector at the word line WL. Transistor TA is in parallel with transistor TB but has its collector connected to word line WL via diode D5. Transistor TB thus determines the word line potential which is higher than VS by about 200 mV.

At time $t4$, transistor TB is turned off while transistor TA remains on. When transistor TB turns off, Transistor TA and diode D5 now determine the word line potential which is raised by about 400 mV so that the word line is now higher than VS by about 600 mV causing transistor T1 to turn off. The cell can now be written into a new state, i.e. turning on transistor T2, by simultaneously driving bit line BLO so that a write current IWS flows through diode D1 at time $t4$ to raise node A to a voltage sufficient to turn transistor T2 on.

In order to show that by raising the voltage of the word line at time $t4$ the write current is reduced, and the entire write-time is reduced, an example is calculated below with assumed values which are in practice actually obtainable:

For purposes of example only, it will be assumed that the emitter current of the switched-on transistor T1 of the storage cell is 6 $\mu$A. The entire base emitter capacity C1 (not shown) is obtained from $Cl = CN + CBE$ where $CN$ equals the diffusion capacity and CBE the junction capacity. Thus in the present example, $Cl = CBE = 0.027$ pF (when $CN$ is almost 0).

The stray capacity C2, at the base of the switched-on transistor T1 is approximately:

$$CS + CC,$$

where CS is the collector stray capacity of transistor T1 and CC the base collector capacity of the PNP transistor T3. The stray capacity C2 at the base of the switched-on transistor T1 is therefore assumed in the present example to be 0.16 pF + 0.016 pF = 0.176 pF.

If now the potential of the emitter of the switched-on transistor T1 is raised by the word line potential by about 400 mV, the following value is obtained for the raising of the potential at the base of transistor T1, $$\Delta VB = \Delta VE \times \frac{C1}{C2}$$

where $\Delta VB$ equals the voltage rise at the base of the transistor T1, and $\Delta VE$ equals the voltage rise at the emitter of the switched-on transistor T1.

At a voltage rise $\Delta VE$ of 0.4 Volt at the emitter of the conductive transistor T1 there is consequently a voltage rise $\Delta VB$ at the base of transistor T1 of:

$$\Delta VB = 0.4 \text{ V} \times \frac{0.027 \text{ pF}}{0.176 \text{ pF}} = 0.062 \text{ V}.$$

In other words, the base voltage practically does not change. Conductive transistor T1 is therefore made nonconductive when the word line is pulsed up by 400 mV. Because of the collector current of load transistor T3 the base potential rises slowly. The charge time is:

$$t = \frac{C \times \Delta V}{I}$$

where
$\Delta V = VE - VB$
$C = CC + CS + CBE.$

In the present example, the capacity to be recharged is:

$$C = 0.016 \text{ pF} + 0.16 \text{ pF} + 0.027 \text{ pF} = 0.203 \text{ pF},$$

the collector current in the PNP transistor is 3 $\mu$A and $V = 0.4 - 0.06 = 0.34$ Volt, then the recharge time $t =$ $$0.203 \times \frac{0.34}{0.003} \text{ ns} = 22.0 \text{ nanoseconds}.$$

However, as shown below, by use of the present invention, the storage cell node A can be recharged with substantially lower current within a shorter time.

At storage cell node A there is now an overall capacity of $C = CC + CS + \beta \times CBC$, with $\beta = 0$. In the present example, there applies:

$$C = 0.02 \text{ pF} + 0.15 \text{ pF} = 0.17 \text{ pF}.$$

It is furthermore assumed that the writing current IWS is now 200 $\mu$A. So for the recharging of storage cell node A by 0.7 Volt there is now a time $t$ of:

$$t = C \times \frac{V}{I},$$

i.e. in the present example $$0.17 \text{ pF} \times \frac{0.7 \text{ V}}{0.2 \text{ mA}} = 0.595 \text{ ns}.$$

It is thus proved that by means of the up-pulsing of the word line WL by means of the circuit according to FIG. 3, at time $t4$, the writing current can be substantially reduced and that the entire write time of the storage cell can be considerably reduced by reducing the time for the recharging of a cell node.

It is also possible to provide a circuit differing from that of FIG. 3, without departing from the principle of the invention. The only points of importance are to substantially reduce the time for recharging a storage cell node, and to up-pulse the word line.

While the invention has been particularly shown and described with reference to the preferred embodiment therefore it will be understood by those skilled in the art that various changes in forms and details of the circuit and method may be made therein without departing from the spirit and scope of the invention and that the method of operation is in no way restricted by the circuit.

What is claimed is:

1. A memory circuit comprising,
    a word line,
    a bit line,
    a memory cell coupled to the word line and the bit line,
    a voltage selection circuit coupled to said word line comprising
    first means for setting said word line at a first voltage level having a given magnitude to permit standby current to flow through the cell,
    second means for setting said word line at a second voltage level having a magnitude lower than the said given magnitude to increase the current flow through the cell to discharge the internal nodes of the cell, and
    third means for setting said word line at a third voltage level having a magnitude higher than said second magnitude to turn off said cross coupled cell, and
    means coupled to said bit line for selectively applying a write current to said cell during the application of said third voltage level to said word line to recharge the state of one of said internal nodes.

2. The memory of claim 1 wherein said third voltage level is intermediate said first and second voltage levels.

3. The memory of claim 1 wherein said first means of said voltage selection circuit comprises a voltage source and a first transistor coupling said word line to said voltage source to produce said second voltage level.

4. The memory of claim 3 wherein said second means of said voltage selection circuit comprises an impedance and a second transistor coupled serially therewith, said impedance and said second transistor coupling said word line to said voltage source to produce said third voltage level.

5. The memory circuit of claim 4 wherein said first means of said voltage selection circuit comprises a pair of diodes coupled to said voltage source and in parallel with said first and second transistors to produce said first voltage level.

6. The memory of claim 5 wherein said voltage selection circuit further includes a second voltage source and impedance means coupling said second voltage source to said word line.

7. The memory circuit of claim 6 wherein said first and second transistors are bipolar transistors and said impedance in series with said second transistor is a diode.

8. The memory circuit of claim 7 wherein said diode is a Schottky diode.

9. The memory circuit of claim 1 wherein said memory cell includes a pair of cross coupled bipolar transistors, respective load transistors coupled serially therewith, and a source of predetermined potential, said load transistors coupling said cross coupled transistors to said source of predetermined potential.

10. The memory circuit of claim 9 wherein said cross coupled bipolar transistors are NPN transistors and said load transistors are bipolar PNP transistors.

11. A memory circuit coupling,
a word line,
first and second bit lines,
a memory cell comprising a pair of cross coupled bipolar transistors coupled to said word line and coupled between said bit lines,
a speed-up circuit coupled to said word line,
said speed-up circuit comprising,
a first transistor coupling said word line to a voltage source,
a second transistor in parallel with said first transistor and in series with an impedance coupling said word line to said voltage source,
means for turning on said first transistor to set a first selected voltage level on said word line; and
means for turning off said first transistor and turning on said second transistor to set a second selected voltage level on said word line; and
means for applying a write current to said cell from one of said bit lines while said second transistor is turned on to set one of said cross coupled transistors in a conductive state.

* * * * *